(12) United States Patent
Tanaka et al.

(10) Patent No.: US 7,772,031 B2
(45) Date of Patent: Aug. 10, 2010

(54) SEMICONDUCTOR APPARATUS MANUFACTURING METHOD

(75) Inventors: Takekazu Tanaka, Kanagawa (JP); Kouhei Takahashi, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 150 days.

(21) Appl. No.: 11/650,495

(22) Filed: Jan. 8, 2007

(65) Prior Publication Data

US 2007/0172980 A1    Jul. 26, 2007

(30) Foreign Application Priority Data

Jan. 24, 2006  (JP)  ............................. 2006-015505
Dec. 27, 2006  (JP)  ............................. 2006-351653

(51) Int. Cl.
*H01L 21/00* (2006.01)
(52) U.S. Cl. ...................................... 438/106; 257/735
(58) Field of Classification Search ................ 438/123, 438/106
See application file for complete search history.

(56) References Cited

U.S. PATENT DOCUMENTS

| 5,164,566 | A | 11/1992 | Spletter et al. |
| 5,306,891 | A | 4/1994 | Fleming et al. |
| 5,452,841 | A | 9/1995 | Shbata et al. |
| 6,193,765 | B1 * | 2/2001 | Nakanishi et al. .......... 29/623.1 |
| 6,801,174 | B2 * | 10/2004 | Kayama et al. ............... 345/76 |
| 6,857,459 | B1 * | 2/2005 | Madrid ....................... 156/542 |
| 6,919,644 | B2 * | 7/2005 | Uchida ........................ 257/784 |
| 2002/0130114 | A1 * | 9/2002 | Evers .................... 219/121.78 |
| 2004/0217474 | A1 * | 11/2004 | Kajiwara et al. ............ 257/734 |

FOREIGN PATENT DOCUMENTS

| EP | 0 326 020 A2 | 8/1989 |
| JP | 1-310547 | 12/1989 |
| JP | 6-244230 | 9/1994 |
| JP | 2002-313851 A | 10/2002 |
| WO | WO 03/015485 A1 | 2/2003 |

* cited by examiner

*Primary Examiner*—Thao X Le
*Assistant Examiner*—Kimberly Trice
(74) *Attorney, Agent, or Firm*—Foley & Lardner LLP (57) ABSTRACT

The semiconductor apparatus includes a semiconductor chip, and a source electrode and a gate electrode which are formed on the semiconductor chip and electrically connected with a lead frame. The source electrode is electrically connected with the lead frame by being laser-welded with a thin-film shaped connecting portion formed at an end of the lead frame. This enables the provision of a semiconductor apparatus with enhanced productivity and yields which exhibits high electrical operability and reliability.

18 Claims, 8 Drawing Sheets

RELATED ART

SEMICONDUCTOR APPARATUS MANUFACTURING METHOD

BACKGROUND OF THE INVENTION

1. Field of the Invention

The present invention relates to a manufacturing method of a semiconductor apparatus including a semiconductor chip and an electrode which is formed on the semiconductor chip and electrically connected with an external lead and, particularly, to a manufacturing method of a semiconductor apparatus capable of carrying a large current.

2. Description of Related Art

Metal-Oxide-Semiconductor Field-Effect Transistors (MOSFETs), which are used for power supply in consumer-electronics products such as cell phones, personal computers, and digital audiovisual equipments or for driving a motor of vehicles, carry a high current of about 5 to 200 A. It thus requires a thick, heavy wire material. For example, a plurality of large-gauge wires of about 100 to 500 μm are connected to the source electrode of a MOSFET in order to draw a high current.

However, the connection of a bonding wire to the source electrode by ultrasonic bonding or thermocompression bonding requires a bonding area of about 1.5 to 3 times the wire cross-sectional area. The area of the source electrode or the gate electrode, however, is limited to small and thus subject to the limitation by the wire cross-sectional area. Further, high pressure application is required to obtain a large bonding strength, and the mechanical impact causes a decrease in yields. This is described in Japanese Unexamined Patent Application Publication No. 2002-313851 (Oono), for example.

Figure 8:
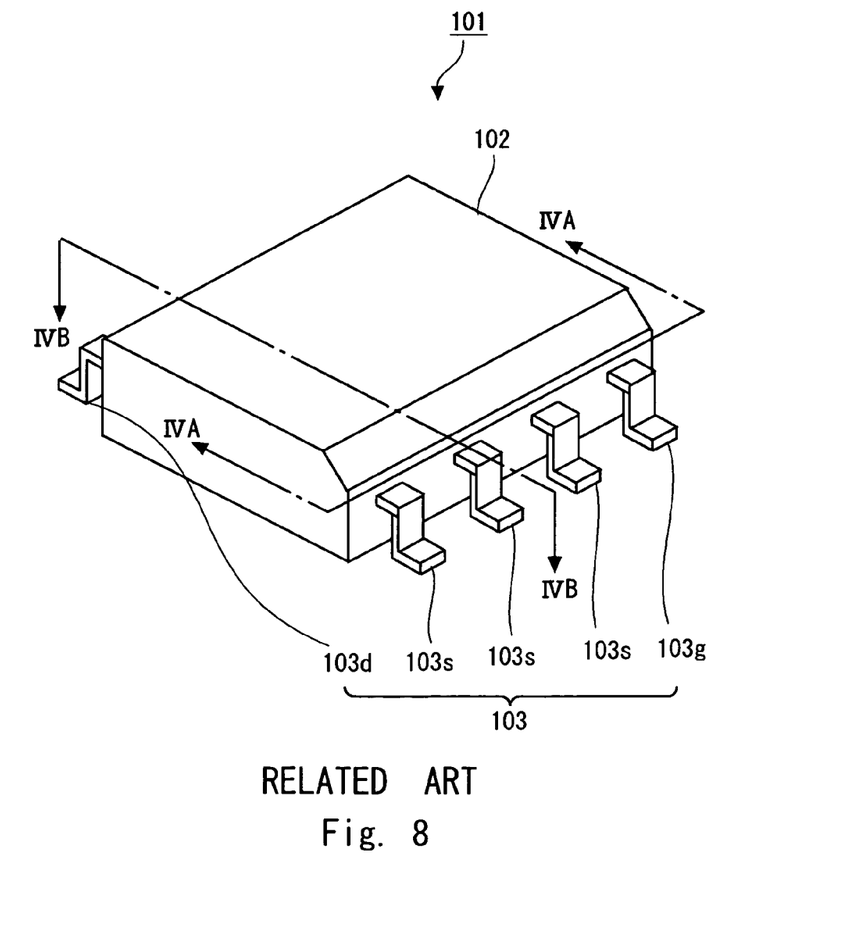
FIG. 8 is a bird's-eye view of a semiconductor apparatus (Small Out-line Package (SOP)—8 packages) disclosed in Oono.
Figure 9A:
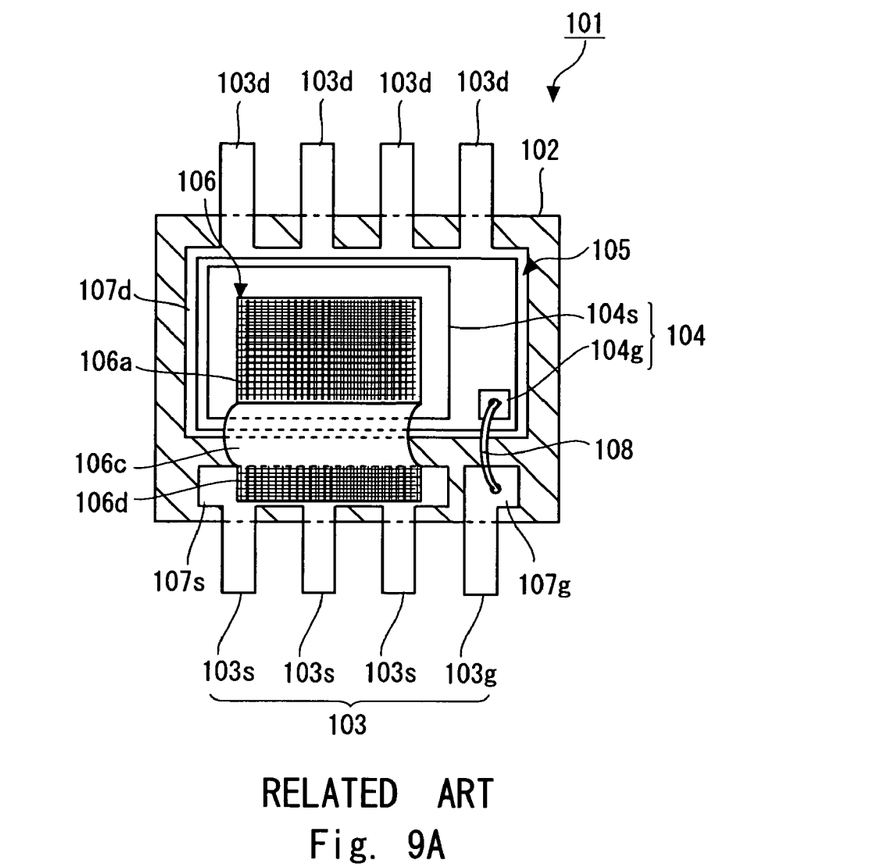
FIGS. 9A and 9B are cross sectional views along lines IVA-IVA and IVB-IVB, respectively, in FIG. 7, showing the semiconductor apparatus disclosed in Oono.
Figure 9B:
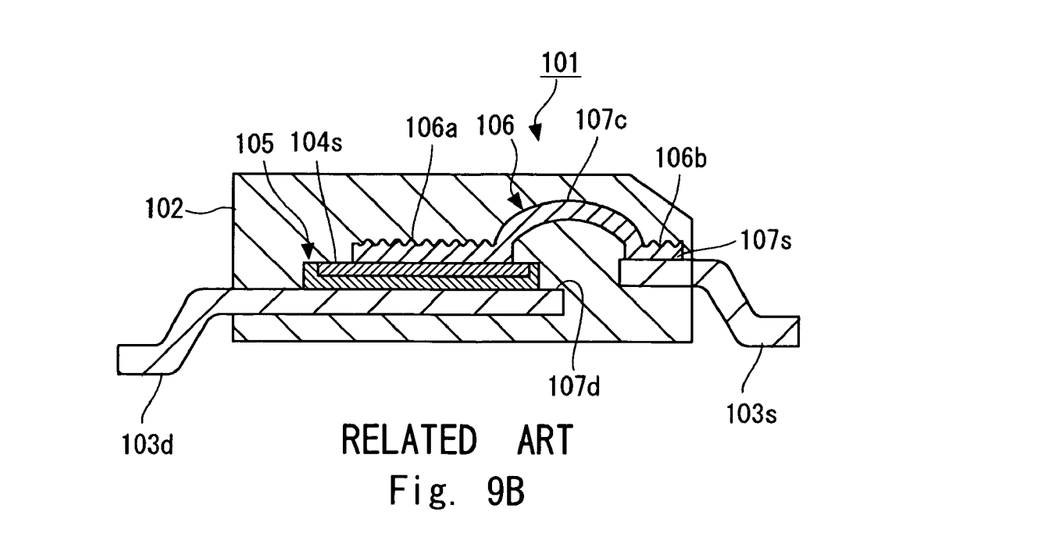

In a semiconductor apparatus disclosed in Oono, a plate-shaped electrical path member is bonded by ultrasonic to thereby obtain a large bonding strength and achieve high yields. FIG. 8 is a bird's-eye view of a semiconductor apparatus (Small Out-line Package (SOP)—8 packages) taught by Oono. FIGS. 9A and 9B are cross sectional views along lines IVA-IVA and IVB-IVB, respectively, in FIG. 8.

Referring to FIG. 8, the MOSFET 101 is almost entirely fixed and covered by a sealing resin (molding resin) 102 which is made of epoxy resin or the like. The MOSFET 101 has eight leads 103, such that one end of each lead 103 is exposed outside the molding resin 102.

Referring then to FIG. 9A, the molding resin 102 includes a semiconductor device (semiconductor chip) 105. On the semiconductor device 105, a source electrode (source pad) 104s and a gate electrode (gate pad) 104g are formed on the top surface, and a drain electrode (drain pad), though not shown, is formed at the end of the under surface.

Four terminals arranged on one side out of the terminals of the eight leads 103 are integrated into one set inside the molding resin 102. The four terminals serve as drain-side terminals 103d of the leads 103 which are to be electrically connected with the drain pad. The remaining four terminals out of the terminals of the eight leads 103 are arranged so as to avoid direct contact with the semiconductor device 105 and to be electrically disconnected from the drain-side terminals 103d and the lead 103 including a drain-side post 107d inside the molding resin 102 as shown in FIG. 9A. Out of the remaining four terminals of the leads 103, three terminals are integrated into one set, and the remaining one terminal is electrically disconnected from those three-in-one terminals of the lead 103.

The thee-in-one terminals of the lead 103 are electrically connected with the source electrode 104s of the semiconductor device 105 by a current path member 106 to serve as source-side terminals 103s of the leads 103. The remaining one terminal of the lead 103 is electrically connected with the gate electrode 104g of the semiconductor device 105 by a single bonding wire 108 to serve as a gate-side terminal 103g of the lead 103.

Referring to FIGS. 9A and 9B, in the current path member 106, an electrode-side connecting portion 106a which is formed at one end is connected by plane with the source electrode 104s, and a lead-side connecting portion 106b which is formed at the other end is connected by plane with a source-side post 107s. The current path member 106 is directly connected to both the source electrode 104s and the source-side post 107s of each source-side terminal 103s of the leads 103 at the same time by ultrasonic bonding.

With the current path member 106, the semiconductor apparatus 101 taught by Oono allows the cross sectional area of the current path flowing between the source electrode 104s of the semiconductor device 105 and the source-side post 107s of each source-side terminal 103s of the leads 103 to be significantly larger than a total of the cross sectional area of the current path flowing through a plurality of bonding wires in a conventional MOSFET. This enables the MOSFET 101 to have significantly lower resistance between the source electrode 104c and the lead 103 compared with a conventional MOSFET.

As a different bonding technique from the ultrasonic bonding, there is laser bonding which uses laser as disclosed in Japanese Unexamined Patent Application Publication No. 1-310547 (Iino), for example. Further, Japanese Unexamined Patent Application Publication No. 6-244230 (Uemura et al.) discloses a bonding technique using both ultrasonic and laser.

However, the ultrasonic bonding described in Oono and Uemura et al. cause damages to products because it is a mechanical bonding technique and also cause oxidation of wires (connecting member) or electrodes because it uses heat.

The bonding process may be carried out at the temperature of about 300° C., for example, so that an oxide film is formed on metal. Further, the temperature in the bonding process is low compared with the melting point of a metal such as a wire member, which is 800° C. to 1100° C. Thus, a mechanical energy is required in order to break the oxide film formed on a wire member and to enable bonding with the low temperature in the bonding process between the electrode and the wire material. In such a case, mechanical vibration is applied so as to break the oxide film and expose a new surface, which cause damage to the chip. Particularly, a MOSFET has an active cell below the pad, and the damage caused by the ultrasonic vibration can reach the element below the pad, which leads to breakdown of a product. Further, because the process forms an alloy by mechanical contact, the bonding is not appropriate for some types of metal.

Further, the technique of laser bonding can cause damage to a base below the electrode. As described above, large-gauge wires of about 100 to 500 μm or above are used to reduce the resistance in order for the MOSFET to carry a high current. This corresponds to the thickness of 100 to 500 μm. On the other hand, the thickness of the electrode to be connected is as small as about 2 to 6 μm as described in Oono. The adjustment of laser intensity is extremely difficult when laser-welding the members having different thicknesses, and it is impossible to provide bonding by the laser welding. High laser intensity to fuse the wire causes breakdown of the base, and low laser intensity fails to establish connection or obtain desired connection intensity.

SUMMARY OF THE INVENTION

According to one aspect of the present invention, there is provided a manufacturing method of a semiconductor apparatus including a semiconductor chip and an electrode formed on the semiconductor chip and electrically connected with an external lead. This method laser-welds the electrode with a thin-film shaped connecting area formed partly or entirely on a connecting portion electrically connected with the external lead.

The method makes the laser welding between the semiconductor chip and the external lead through the connecting portion. It uses a thin-film shaped connecting area which is formed partly or entirely on the connecting portion, thereby enabling laser welding with an electrode which is normally significantly thinner than the connecting portion. This achieves the establishment of electrical connection without mechanical vibration.

The present invention provides a semiconductor apparatus manufacturing method which enables an increase in productivity and yields and exhibits high electrical operability and reliability.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

An exemplary embodiment of the present invention is described hereinafter in detail with reference to the drawings. In the below-described embodiment, the present invention is applied to a semiconductor apparatus for carrying a high current which is used for power supply or switches in cell phones, motors and so on, in which a number of MOSFETs are combined into one MOSFET. While a single transistor normally carries a current of about 0.1 A, such a transistor can carry a current of about 5 to 200 A and can be used for power supply in consumer-electronics products, motor driving in vehicles or the like.

Figure 1A:
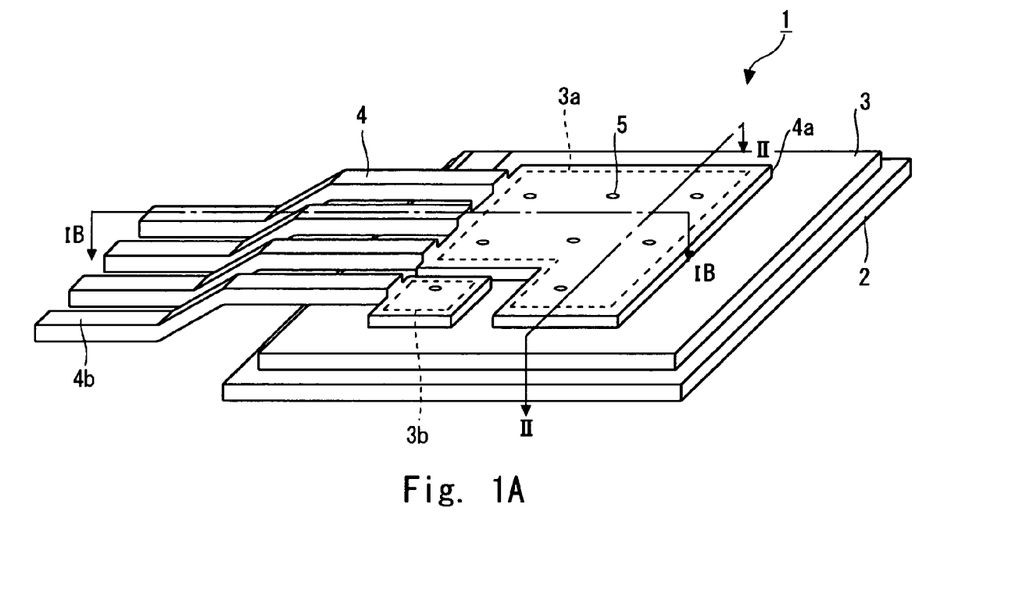
FIG. 1A is a perspective view of a semiconductor apparatus according to an embodiment of the present invention.
Figure 1B:
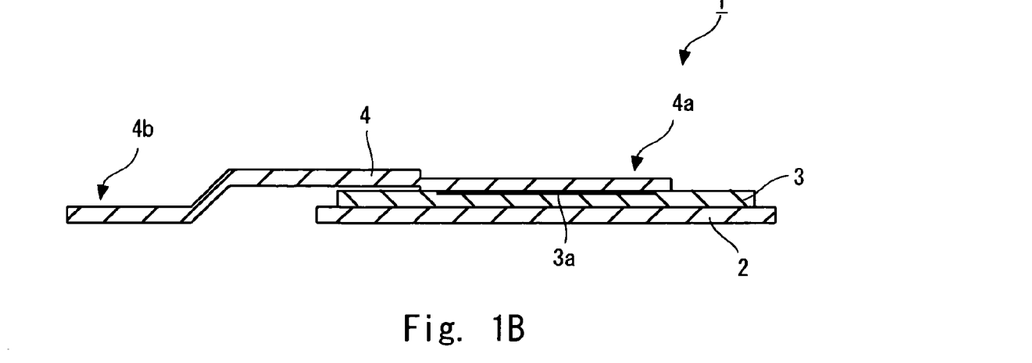
FIGS. 1B and 1C are cross-sectional views along line IB-IB in FIG. 1A.
Figure 1C:
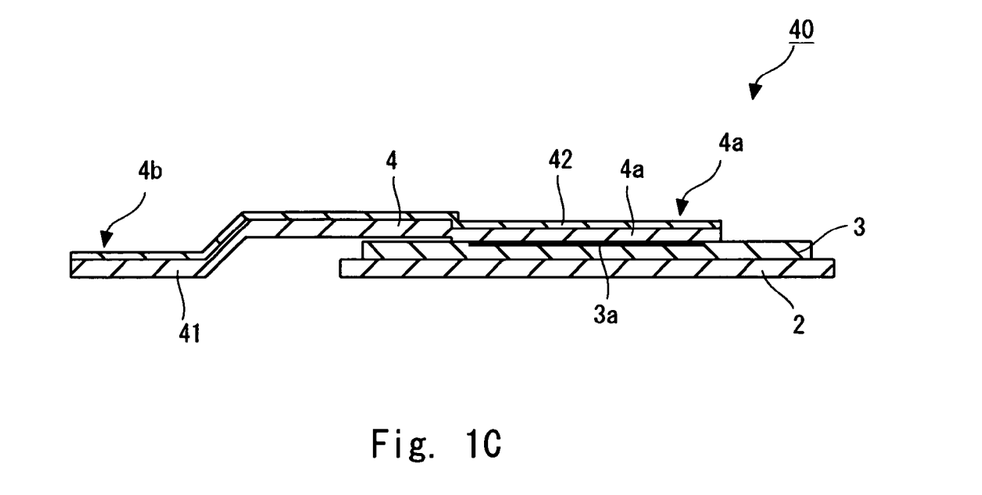

FIG. 1A is a perspective view of a semiconductor apparatus according to an embodiment of the present invention. FIGS. 1B and 1C are cross-sectional views along line IB-IB in FIG. 1A. As shown in FIGS. 1A and 1B, a semiconductor apparatus 1 includes a die pad (island) 2 formed on a lead frame, a semiconductor chip (die) 3 which is mounted on the die pad 2, and a lead frame 4 which is electrically connected with the semiconductor chip 3. Typically, these elements are covered with a molding resin made of epoxy resin or the like and packaged entirely except for one end (outer lead (external lead) 4b) of the lead frame 4.

The lead frame 4 includes a portion for mounting the semiconductor chip 3 (which is referred to as the die pad or the internal lead) and a portion projecting outside of the package and soldered to a substrate (which is referred to as the external lead). Because a different feature is required for each portion, the die pad and the internal lead may be nickel-plated or non-plated, and the external lead may be solder- or tin-plated, for example.

The semiconductor chip 3 may be formed of a vertical MOSFET, for example. A drain electrode, though not shown, is formed on its under surface and connected to the die pad 2. An external lead, also not shown, which is connected with the die pad 2 serves as a drain-side terminal. On the upper surface of the semiconductor chip 3 are formed a source electrode (electrode pad) 3a and a gate electrode (electrode pad) 3b. A connecting portion 4a having a thin-film shape (flat-plate or ribbon-like shape) which is formed at the end of the internal lead of the lead frame 4 is electrically connected with the source electrode 3a and the gate electrode 3b. In the semiconductor apparatus 1 illustrated in FIG. 1B, the lead frame 4 is not plated. In a semiconductor apparatus 40 illustrated in FIG. 1C, on the other hand, the lead frame 4 includes a base 41 such as Cu and a plating layer 42 such as Ni which is formed on the base 41.

In the semiconductor apparatus 1 according to this embodiment, the connecting portion 4a of the lead frame 4 is bonded by laser welding with the source electrode 3a and the gate electrode 3b, and one or a plurality of weld-bonding portions 5 are provided depending on the bonding area. The use of laser welding for connection facilitates the positioning between the lead frame 4 and the semiconductor chip 3 and thus enables easier manufacturing such as one-time connection using a galvanometer mirror or the like.

As described earlier, the connecting member such as the internal lead or the wire and the electrodes on the semiconductor chip 3 cannot be laser-welded simply. While the thickness of the electrode on the semiconductor chip 3 is typically about 4 to 5 μm, the thickness of the connecting member such the wire is about several tens to hundreds times greater. If a thickness ratio of the members to be welded differs largely, the use of high laser power with the intent to weld those members can result in breakdown of the base underneath. On the other hand, the use of low laser power fails to establish connection or obtain desired connection intensity. Thus, the breakdown of the elements below the electrode can occur unless optimizing the thickness of the connecting portion with respect to the thickness of the electrode.

On the other hand, the technique of using the ribbon-like or flat-plate connecting member and performing the ultrasonic bonding as disclosed in Oono causes the element to be subject to breakdown due to the mechanical vibration, and the ultrasonic bonding of a large area requires a large-scale machine to increase manufacturing costs.

The inventor of the present invention has found that a connecting member and electrodes on the semiconductor chip 3 can be laser-welded by forming at least apart of the connecting member to be electrically connected with the electrode, which is referred to hereinafter as the connecting portion, into a thin-film shape (flat-plate or ribbon-like shape) and minimizing a difference (ratio) in thickness between the connecting portion and the electrodes. Accordingly, the lead frame 4 of this embodiment has the connecting portion 4a having a thin-film shape which is thinner than the other part. The laser welding is applied between the connecting portion 4a and the electrodes 3a and 3b. As described later, the connecting portion 4a is not necessarily entirely thin-film shaped. The laser welding is possible with equal effect as long as at least an area to be laser-welded, which is a part of the connecting portion 4a, is thin-film shaped to serve as a welding area.

Specifically, the inventor of the present invention has found that suitable connection intensity can be obtained by laser welding without damaging the base below the electrodes by setting the thickness of the connecting portion 4a to be less than thirty times the thickness of the electrodes 3a and 3b on the semiconductor chip 3. The thickness of the connecting portion 4a is preferably 5 to 30 times, more preferably 10 to 20 times, the thickness of the electrodes 3a and 3b.

As described earlier, when using laser welding, it is preferred to set an appropriate thickness ratio between the connecting portion 4a and the electrodes 3a and 3b. If the thickness of the connecting portion 4a is more than thirty times the thickness of the electrodes 3a and 3b, high laser power is required for the laser welding. This can cause damage underneath the electrode, which leads to breakdown of the element. Specifically, the laser fusing of the thick connecting portion 4a can cause the laser to penetrate through the thin electrodes 3a and 3b to break down the base underneath. For example, if the wire is about 500 μm thick and the electrode is about 5 μm thick, the laser can undesirably reach beyond the depth of 5 μm, or, even if the laser does not reach beyond the electrode thickness range, undesirable variation occurs in the bonding strength or the like. It is thus preferred that the thickness of the connecting member is less than 30 times the thickness of the electrode.

Although it is ideal for the laser welding to equalize the thickness of the electrodes and the thickness of the connecting portion 4a, if the thickness of the connecting portion 4a is less than 5 times the thickness of the electrodes 3a and 3b, it is unable to secure enough strength of the connecting portion 4a, which is not practical, Thus, the thickness of the connecting portion 4a is preferably equal to or more than 5 times the thickness of the electrodes 3a and 3b, or more preferably equal to or more than 10 times to obtain more stable intensity. For example, if the thickness of the electrodes 3a and 3b is 5 μm, the thickness of the connecting portion 4a of the lead frame 4 is preferably about 25 to 150 μm.

Further, it is preferred to determine the contact area of the connecting portion 4a with the electrodes 3a and 3b based on the thickness of the connecting portion 4a and the current flowing through the electrodes 3a and 3b. It is further preferred to determine the contact area based on a prescribed electrical resistance in the connecting portion between the connecting portion 4a and the electrodes 3a and 3b.

As described above, the semiconductor apparatus according to this embodiment may carry a current of 5 to 200 A, and it is preferred to design the sizes of the connecting portion 4a and the electrodes 3a and 3b such that the contact area is in accordance with desired current and resistance values. The contact area indicates the area where the connecting portion 4a is actually in contact with the electrodes 3a and 3b, not the area of the entire connecting portion 4a. Specifically, the connecting portion 4a is laser-welded at a plurality of points, and the part surrounded by the outermost weld-bonding portions 5 serves as the contact area.

The electrical resistance of the contacting portion 4a is preferably low for smaller current loss. However, because the semiconductor apparatus (MOSFET) 1 controls ON/OFF of a switch by a prescribed resistance value, the resistance to enable the switching function is required at least. It is thus preferred to determine the thickness of the connecting portion 4a and the contact area based on the resistance value necessary to serve as a switch.

Figure 2:
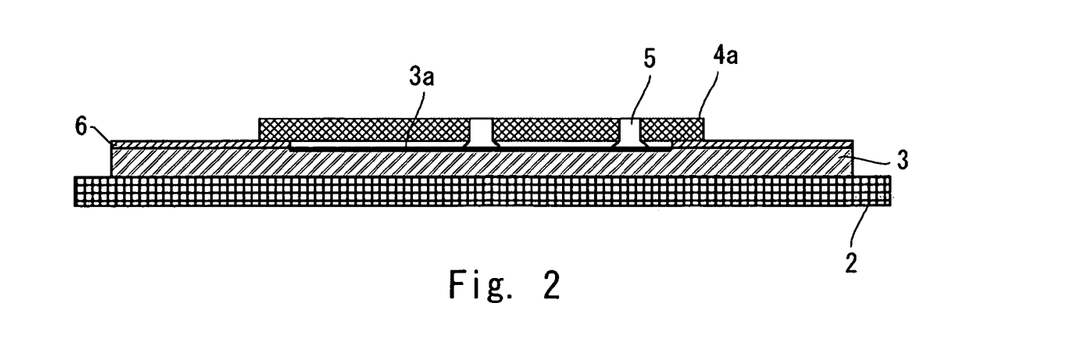
FIG. 2 is a cross-sectional view along line II-II in FIG. 1A, showing a semiconductor apparatus according to the embodiment of the present invention.

The area of the connecting portion 4a may be larger than the area of the electrodes 3a and 3b. FIG. 2 is a cross sectional view along line II-II in FIG. 1A. As shown in FIG. 2, the electrode 3a is formed on the semiconductor chip 3 which is mounted on the die pad 2. A nonconductive cover layer 6 which may be made of polymide (PI), phosphate glass (PSG), an oxide film or the like is formed in the vicinity of the electrode 3a to cover the elements around the electrode 3a. This prevents the connecting portion 4a from being electrically continuous with other elements even if the connecting portion 4a is larger than the actual area of the electrode 3a. This further facilitates the positioning between the connecting portion 4a and the electrodes 3a and 3b because of the connecting portion 4a being large.

Because the part of the connecting portion 4a which extends off the electrodes 3a and 3b is placed on the insulating cover material 6, no electrical continuity is established when the contacting portion 4a contacts the elements in the vicinity of the electrode 3a. Although a sight gap can be present between the connecting portion 4a and the electrode 3a in this case, the connecting portion 4a and the electrode 3a are fused by the laser welding into a bonding portion 5 to thereby allow them to be electrically bonded. FIG. 2 schematically illustrates that.

The connecting portion 4a (lead frame 4) is typically formed of aluminum, copper, or an alloy of those. The use of gold, silver, palladium, or an alloy of those is also possible. Further, a metal material may be formed on the surface of such a connecting member.

The copper is particularly suitable for use as a connecting member because of its high conductivity; however, it has low laser absorbency. Therefore, for easier laser welding, it is possible to provide the plating of nickel (Ni) having high laser absorbency on the surface of copper or form an alloy of Ni and copper.

In a MOSFET, for example, a gate electrode is formed below a source electrode (lead electrode) with an insulating film interposed therebetween. The insulating film may be formed of oxide silicon glass (BPSG: borophosphorous silicate glass) added with phosphorous and boron, PSG (phosphorous silicate glass) or the like. If damage is applied to the insulating film by laser welding, the MOSFET becomes inoperable. It is therefore preferred that the insulating film as the base is formed of a heat resistant material.

When using the lead frame 4 as a connecting material, a beam to bridge the lead frame 4 and the electrodes 3a and 3b is formed by bending or the like. In this case, the shape of the end of the lead frame 4 (connecting portion 4a) may be adjusted appropriately according to the chip size.

It the lead frame 4 and the electrodes 3a and 3b are connected electrically, not by the wire bonding through a different connecting member (wire) as in a conventional technique, the connecting part decreases to enable the provision of more reliable semiconductor apparatus.

If the connecting portion 4a and the electrodes 3a and 3b are connected by ultrasonic bonding, it is necessary to make oscillation at a bonding portion. This requires the positioning between the connecting portion 4a and the electrodes 3a and 3b with an accuracy of about ±25 μm. On the other hand, the laser welding, which is employed in this embodiment, assures good bonding with the positioning accuracy of about ±100 μm. Because of such a rough positioning accuracy required, the number of times to check the lead or chip position for the positioning can be reduced to thereby lower the manufacturing costs.

Further, the laser welding fuses the metal of the connecting portion 4a of the lead frame 4 and the electrodes 3a and 3b completely for connection, thus enabling the bonding of dissimilar metals. This eliminates the need for the process of forming electroless nickel/displacement gold plating or electroless copper plating suitably adhered to an aluminum electrode of a semiconductor wafer, which is called the UBM (underbump metal) process, or rewiring, thereby enabling the provision of low cost semiconductor apparatus.

Furthermore, the bonding by the laser welding does not apply any mechanical stress, thus not causing damage to the semiconductor chip 3 to thereby increase yields. In addition, because the laser welding is a normal temperature process in which heat is generated only in the welding portion, it does not cause oxidation of the lead frame 4 or the semiconductor chip 3.

A manufacturing method of the semiconductor apparatus according to this embodiment is described hereinafter. This embodiment uses an external lead (lead frame) 4 whose end is shaped into the thin-film connecting portion 4a. The lead frame 4 of such a shape can be obtained by forming the thin-film shaped connecting portion 4a simultaneously during molding. This enables the formation of the lead frame 4 with the thin-film shaped connecting portion 4a to enable laser welding without any additional step. The connecting portion 4a is formed at the end of the lead frame 4 so as to have a given thickness and the size and shape according to the electrodes 3a and 3b of the semiconductor chip 3.

Then, the semiconductor chip 3 is mounted on the die pad 2. The die pad 2 and the semiconductor chip 3 may be electrically connected by soldering, silver paste, or the like. The lead frame 4 is placed thereon so that the connecting portion 4a of the lead frame 4 and the electrodes 3a and 3b on the semiconductor chip 3 are placed on one another. As described above, the positioning accuracy may be about ±100 μm because they are to be bonded by laser welding.

Figure 3A:
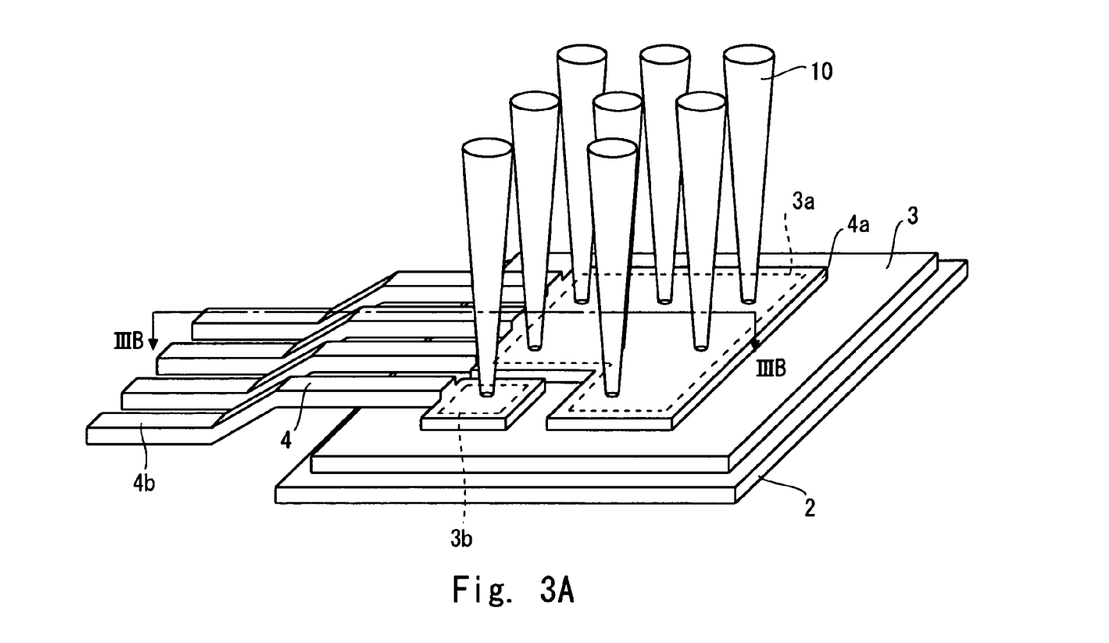
FIGS. 3A and 3B are views to describe a semiconductor apparatus manufacturing method according to the embodiment of the present invention.
Figure 3B:
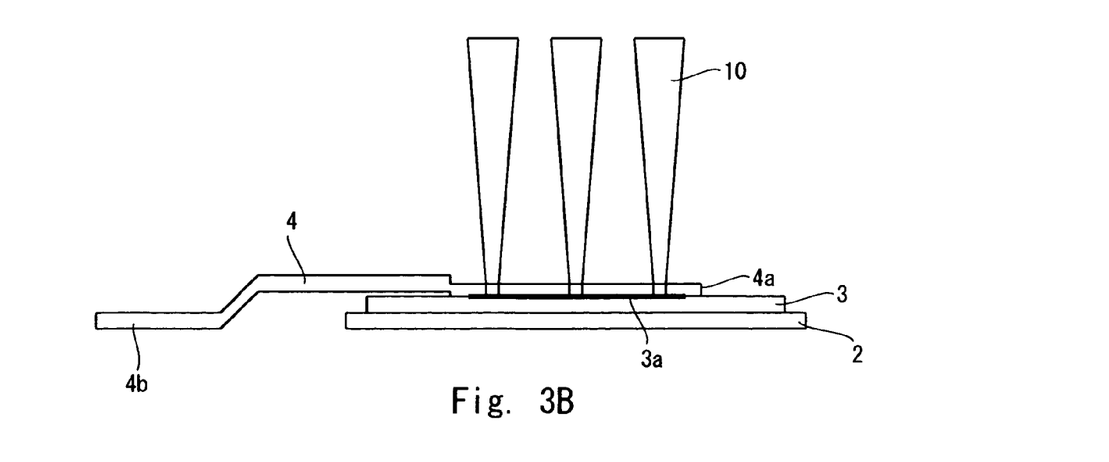

Referring now to FIGS. 3A and 3B, laser is applied to partly fuse the connecting portion 4a of the lead frame 4 and the electrodes 3a and 3b to thereby weld the metals. For example, the connecting portion 4a and the source electrode 3a may be welded at a plurality of positions with a prescribed interval because the electrode 3a is large.

The use of a galvanometer for the laser welding enables one-time connection to enhance the productivity. The semiconductor chip 3 and the lead frame 4 can be connected easily as described above.

The connection between the lead frame 4 and the electrodes 3a and 3b is not necessarily made by directly connecting the end of the lead frame 4 which is processed as above. Alternatively, the lead frame 4 and the electrodes 3a and 3b may be connected through a different connecting member. In this case, the ratio of the thickness of the electrodes and the thickness of the connecting member should be 30 or lower, or preferably in the range of 5 to 30. The connecting member may be a wire or a ribbon-like connecting member, for example.

Figure 4A:
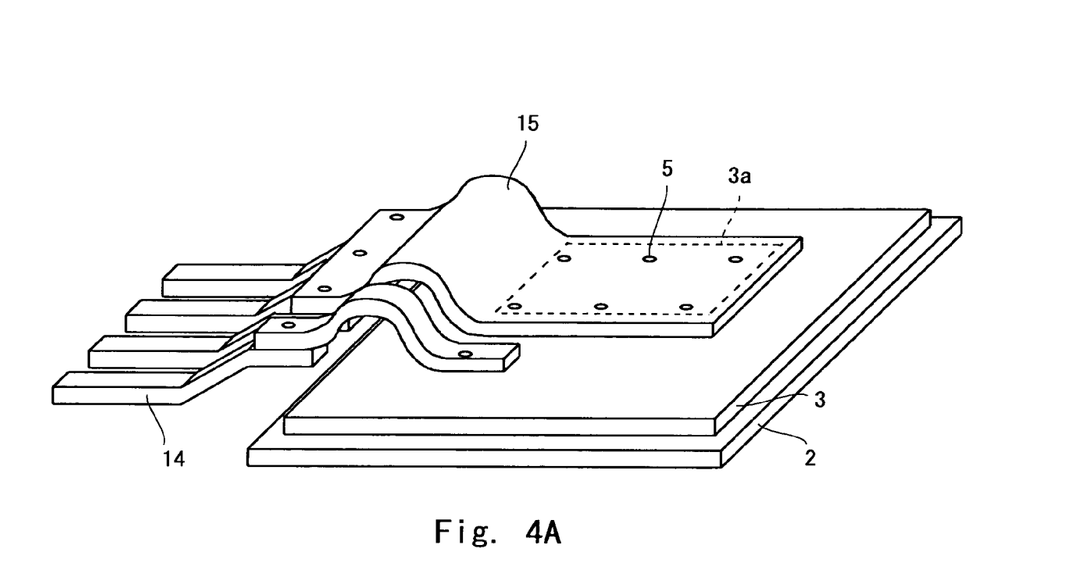
FIGS. 4A and 4B are views showing another example of a semiconductor apparatus according to the embodiment of the present invention, which are a perspective view and a cross-sectional view when using a ribbon-like connecting member, respectively.
Figure 4B:
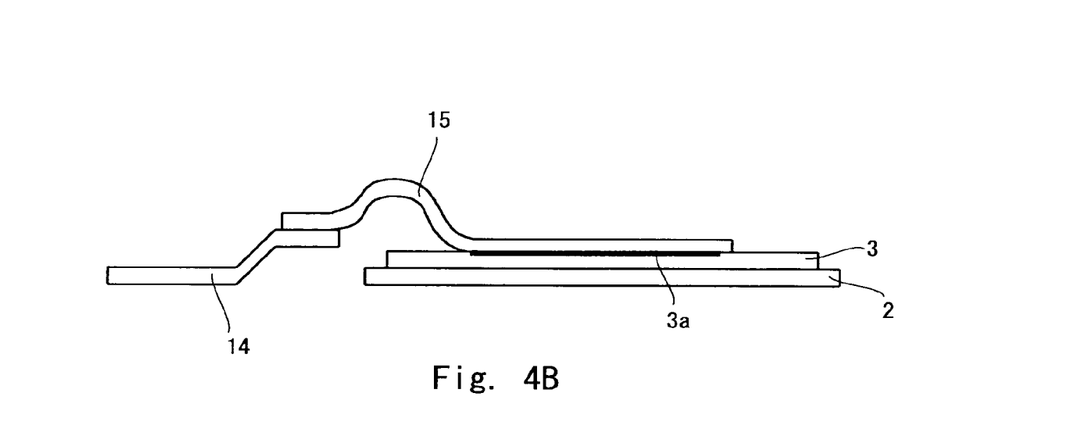
Figure 5A:
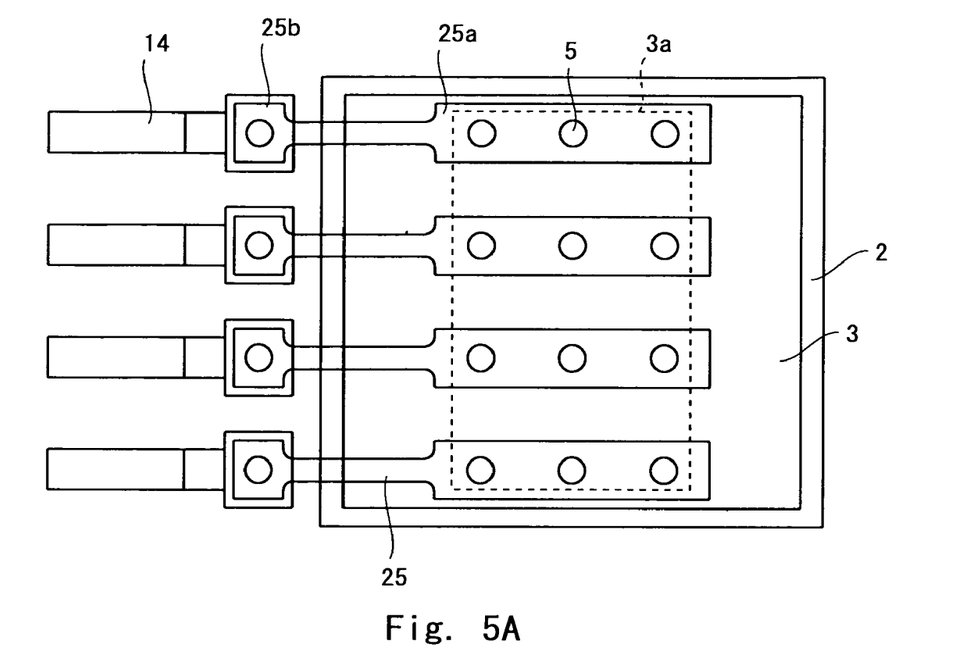
FIGS. 5A and 5B are views showing another example of a semiconductor apparatus according to the embodiment of the present invention, which are a perspective view and a cross-sectional view when using a wire, respectively.
Figure 5B:
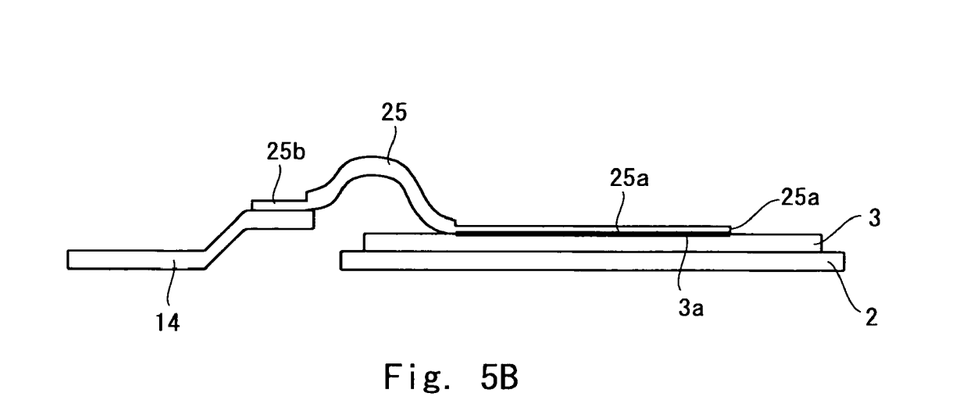

FIGS. 4A and 4B illustrate the case of using a ribbon-like connecting member, and FIGS. 5A and 5B illustrate the case of using a wire. FIGS. 4A and 4B are a perspective view and a cross-sectional view, respectively. In the following description, the same elements as in FIGS. 1 and 2 are denoted by the same reference numerals and not described in detail herein. This embodiment uses a ribbon-like connecting member 15 for the connection between the lead frame 14 and the electrodes on the semiconductor chip 3. Specifically, one end of the lead frame 14 and one end of the ribbon-like connecting member 15 are electrically connected, and the other end of the ribbon-like connecting member 15 and the electrodes 3a and 3b of the semiconductor chip 3 are electrically connected. The connection of the ribbon-like connecting member 15 with the semiconductor chip 3 and the lead frame 14 is made by the laser welding. The ribbon-like connecting member 15 is thinner than the lead frame 14, and a thickness ratio of the ribbon-like connecting member 15 with respect to the electrodes 3a and 3b of the semiconductor chip 3 is set to 30 or lower, or preferably 5 to 30. The lead frame 14 is thicker than the ribbon-like connecting member 15, and a thickness ratio of the lead frame 14 with respect to the ribbon-like connecting member 15 is set to 30 or lower for stable laser welding. In the laser welding between the lead frame 14 and the ribbon-like connecting member 15, the thickness ratio is not necessarily 30 or lower because there is no risk of damaging a lower-layer element.

FIGS. 5A and 5B are a top view and a cross-sectional view, respectively. They show the case of using a wire 25 for the connection of the lead frame 14 and the electrodes of the semiconductor chip 3. As shown in FIGS. 5A and 5B, the lead frame 14 and a connecting portion 25b formed at one end of the wire 25 are electrically connected, and a connecting portion 25a formed at the other end of the wire 25 and the electrodes of the semiconductor chip 3 are electrically connected. Although the wire 25 normally has a circular cross section, the ends (connecting portions 25a and 25b) of the wire 25 are thin-plate shaped in this embodiment for the laser welding with the lead frame 14 and the electrodes, respectively.

In this case also, a thickness ratio of the flat-plate connecting portion 25a of the wire 25 and the electrodes 3a and 3b is preferably within the range of 5 to 30 for the same reasons as described above. The connecting portion 25b to be welded with the lead frame 14 is also preferably shaped into a flat plate for easier laser welding.

As described above, it is possible to perform laser welding with the electrodes on the semiconductor chip by forming a thin-film connecting area in a part of the connecting portion.

Figure 6A:
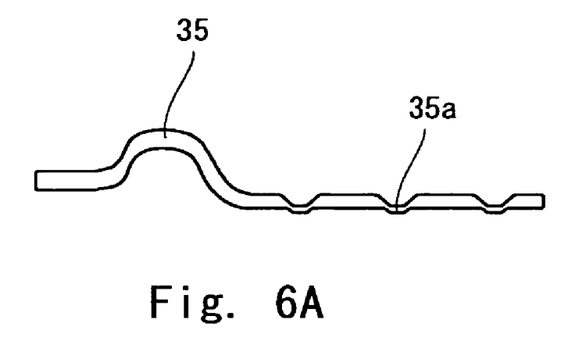
FIGS. 6A and 6B are a view showing a connecting portion after dimpling and a view showing the step of laser welding using the connecting portion after dimpling, respectively.
Figure 6B:
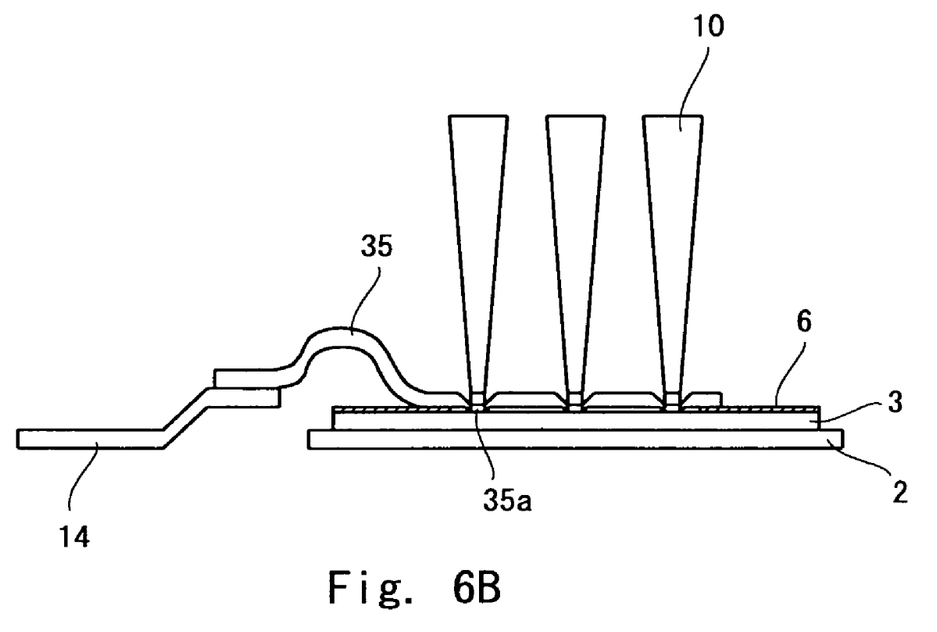

FIG. 6 illustrates such a case. FIG. 6A shows the connecting portion after dimpling, and FIG. 6B shows the process of laser welding using the dimples.

As shown in FIGS. 6A and 6B, a dimple 35a is formed at one end of the connecting member 35 to serve as a connecting portion by molding or the like. The dimple 35a is thinner than the other part, which allows optimization of the thickness ratio with the electrodes 3a and 3b. The same effect is obtained when the dimple 35a and the electrodes on the semiconductor chip 3 are welded by laser 10. Although the dimpling is performed on the connecting member 35 to form the dimple 35a in this example, the dimpling may be performed to make connection between the lead frame 14 and the semiconductor chip 3. Specifically, the dimpling may be performed at one end of the lead frame 14 to be connected with the semiconductor chip so as to form a dimple to serve as a welding area.

Figure 7:
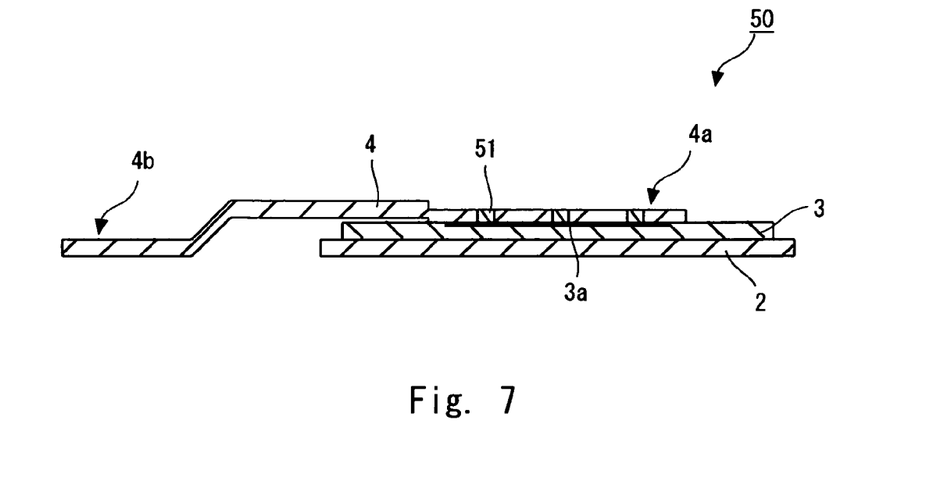
FIG. 7 is a view showing a lead frame in another example of a semiconductor apparatus according to the embodiment of the present invention.

Further, as a semiconductor apparatus 50 shown in FIG. 7, the connecting area of the connecting portion 4a to become the bonding portion 5 may have an opening which is filled with metal, as a bonding material 51, that is highly absorbent of laser light. For example, if the connecting portion 4a (lead frame 4) is made of Cu, the bonding material 51 may be metal having higher absorbency of laser light than Cu, such as aluminum, Ni, aluminum alloy, and Ni alloy. Expressly to bonding material 51 and the connecting area of the connecting portion 4a contain aluminum and copper, respectively. Lesser laser light power may be applied to laser-weld the bonding material 51 because a melting point of aluminum or aluminum alloy is lower than a melting point of Cu or Cu alloy. The bonding material 51 maybe placed in the position of each bonding portion 5 to which laser light is applied as shown in FIG. 7, or may be plate-shaped to cover the positions of a plurality of bonding portions 5.

When applying laser light to the bonding material 51, the laser light may be applied to the bonding material 51 only or to the bonding material 51 and the surrounding connection portion 4a. If the laser light is applied to both of the bonding material 51 and the surrounding connecting portion 4a at the same time, it is possible to monitor the progress to control the laser light so as to melt the bonding material 51 without allowing the connecting portion 4a to melt. This prevents overheating of the bonding portion 5, thereby avoiding the breakdown of elements and increasing yields.

It is apparent that the present invention is not limited to the above embodiment that may be modified and changed without departing from the scope and spirit of the invention.

What is claimed is:

1. A manufacturing method of a semiconductor apparatus, comprising:
   forming a connecting portion including a thin-film shaped connecting area therein, the connecting portion being electrically connected with an external lead, a thickness of the thin-film shaped connecting area being thinner than the external lead; and
   welding the thin-film shaped connecting area of the connecting portion and an electrode on a semiconductor chip by laser welding, wherein a thickness ratio of the thin-film shaped connecting area with respect to the electrode is in a range of 5 to 30,
   wherein the external lead and the connecting portion are mutually connected to each other so as to form as a single part, a thickness of the connecting portion is equal to that of the thin-film shaped connecting area.

2. The manufacturing method of a semiconductor apparatus according to claim 1, wherein a thickness of the thin-film shaped connecting area is determined based on a thickness of the connecting portion and desired current and resistance values.

3. The manufacturing method of a semiconductor apparatus according to claim 1, wherein the connecting portion includes a dimple as the thin-film shaped connecting area, a thickness of another part of the connecting portion except for the thin-film shaped connecting area is thicker than that of the thin-film shaped connecting area.

4. The manufacturing method of a semiconductor apparatus according to claim 1, further comprising:
   a nonconductive cover layer in close proximity to the electrode,
   wherein an area of the connecting portion is larger than an exposed area of the electrode from the nonconductive cover layer.

5. The manufacturing method of a semiconductor apparatus according to claim 1, wherein laser-welding is performed by applying laser light to a plurality of positions on the connecting portion.

6. The manufacturing method of a semiconductor apparatus according to claim 1, wherein the electrode is formed of a metal containing at least one of aluminum and copper.

7. The manufacturing method of a semiconductor apparatus according to claim 1, wherein the connecting portion is made of a material containing at least one metal selected from a group consisting of aluminum, copper, gold, silver, palladium and nickel.

8. The manufacturing method of a semiconductor apparatus according to claim 1, wherein the connecting portion is formed of nickel-plated copper or copper alloy.

9. The manufacturing method of a semiconductor apparatus according to claim 1, comprising:
   an opening formed in the connecting portion, and
   a bonding material filled in the opening as the thin-film shaped connecting area of the connecting portion,
   wherein laser light is applied to an area including the bonding material to laser-weld the bonding material and the electrode.

10. The manufacturing method of a semiconductor apparatus according to claim 9, wherein
    a melting point of the bonding material is lower than a melting point of a material of the connecting portion.

11. The manufacturing method of a semiconductor apparatus according to claim 9, wherein
    the bonding material contains aluminum and the material of the connecting portion contains copper.

12. The manufacturing method of a semiconductor apparatus according to claim 1, wherein
    the semiconductor chip includes a transistor including a gate electrode and a source electrode on a top surface and a drain electrode on a bottom surface,
    a drain lead is integrated with the die pad, and
    the external lead includes a source lead electrically connected with the source electrode.

13. The manufacturing method of a semiconductor apparatus according to claim 12, wherein the transistor includes a metal-oxide-semiconductor (MOS) transistor.

14. A manufacturing method of a semiconductor apparatus, comprising:
    forming a connecting portion including a thin-film shaped connecting area therein, the connecting portion being electrically connected with an external lead, a thickness of the thin-film shaped connecting area being thinner than the external lead; and
    welding the thin-film shaped connecting area of the connecting portion and an electrode on a semiconductor chip by laser welding, wherein a thickness ratio of the thin-film shaped connecting area with respect to the electrode is in a range of 5 to 30, wherein the semiconductor apparatus includes a plurality of external leads each of which is electrically connected to the electrode of the semiconductor chip, the semiconductor apparatus further comprising:

a plurality of wires, each of which being separated from the external lead, wherein the connecting portion including the thin-film shaped connecting area is formed at one end of each of the plurality of wires, each of the plurality of wires includes a thicker part adjacent to the connecting portion, and the other end of each of the plurality of wires is electrically connected with the corresponding external lead.

15. The manufacturing method of a semiconductor apparatus according to claim 14, wherein the other end of each of the plurality of wires and the corresponding external lead are laser-welded.

16. A manufacturing method of a semiconductor apparatus comprising:

forming a connecting portion including a thin-film shaped connecting area therein, the connecting portion being electrically connected with an external lead, a thickness of the thin-film shaped connecting area being thinner than the external lead; and welding the thin-film shaped connecting area of the connecting portion and an electrode on a semiconductor chip by laser welding, wherein a thickness ratio of the thin-film shaped connecting area with respect to the electrode is in a range of 5 to 30, wherein the semiconductor apparatus includes the external lead which is electrically connected to the electrode of the semiconductor chip, the semiconductor apparatus further comprising:

a thin-film conductive ribbon separated from the external lead, wherein the connecting portion including a dimple in the thin-film shaped connecting area is formed at one end of the thin-film conductive ribbon, the thin-film conductive ribbon includes a thicker part adjacent to the thin-film shaped connecting area, and the other end of the thin-film conductive ribbon is electrically connected with each of the plurality of external leads.

17. The manufacturing method of a semiconductor apparatus according to claim 16, wherein the other end of the thin-film conductive ribbon and each of the plurality of external leads are laser-welded.

18. A manufacturing method of a semiconductor apparatus which comprises a semiconductor chip that includes active transistor cells formed therein, and a gate electrode, a source electrode and a drain electrode electrically connected to the active transistor cells, respectively, at least the source electrode being formed immediately above the active transistor cells, comprising:

forming a connecting portion including a thin-film shaped connecting area therein, the connecting portion being electrically connected with an external lead, a thickness of the thin-film shaped connecting area being thinner than the external lead; and welding the thin-film shaped connecting area of the connecting portion and the source electrode by laser welding, wherein a thickness ratio of the thin-film shaped connecting area with respect to the source electrode is in a range of 5 to 30, wherein the external lead and the connecting portion are mutually connected to each other so as to form as a single part, a thickness of the connecting portion is equal to that of the thin-film shaped connecting area.

* * * * *